United States Patent
Weinberger et al.

(10) Patent No.: US 12,317,616 B2
(45) Date of Patent: May 27, 2025

(54) PHOTODETECTOR HAVING AN AVALANCHE PHOTODIODE, RADIATION DETECTOR, POSITRON EMISSION TOMOGRAPH AND METHOD FOR OPERATING A PHOTODETECTOR

(71) Applicant: Helmholtz-Zentrum Dresden-Rossendorf e.V., Dresden (DE)

(72) Inventors: David Weinberger, Dresden (DE); Toni Kögler, Dresden (DE); Guntram Pausch, Dresden (DE)

(73) Assignee: Helmholtz-Zentrum Dresden-Rossendorf e.V., Dresden (DE)

( * ) Notice: Subject to any disclaimer, the term of this patent is extended or adjusted under 35 U.S.C. 154(b) by 198 days.

(21) Appl. No.: 18/019,602

(22) PCT Filed: Jul. 21, 2021

(86) PCT No.: PCT/EP2021/070402
§ 371 (c)(1),
(2) Date: Feb. 3, 2023

(87) PCT Pub. No.: WO2022/028896
PCT Pub. Date: Feb. 10, 2022

(65) Prior Publication Data
US 2023/0282655 A1    Sep. 7, 2023

(30) Foreign Application Priority Data

Aug. 6, 2020 (DE) .................. 102020120789.1

(51) Int. Cl.
*G01T 1/20* (2006.01)
*G01T 1/29* (2006.01)
(Continued)

(52) U.S. Cl.
CPC ..... *H10F 39/8023* (2025.01); *G01T 1/20182* (2020.05); *G01T 1/2985* (2013.01); *H10F 39/1898* (2025.01)

(58) Field of Classification Search
CPC ......... H01L 27/14605; H01L 27/14663; H01L 27/1443; H01L 27/1446; G01T 1/20182; G01T 1/2985
See application file for complete search history.

(56) References Cited

U.S. PATENT DOCUMENTS

2002/0139970 A1* 10/2002 Iwanczyk ......... H01L 27/14643
257/E31.063
2006/0124832 A1   6/2006 Harmon et al.
(Continued)

FOREIGN PATENT DOCUMENTS

EP    2813866 A1    12/2014

*Primary Examiner* — Kiho Kim
(74) *Attorney, Agent, or Firm* — Murphy, Bilak & Homiller, PLLC

(57) ABSTRACT

A photodetector (90) having an exposure surface (91) has a first photodiode array (1) having a first light entry surface (11) and a second photodiode array (2) having a second light entry surface (21). The first photodiode array (1) has an avalanche photodiode (10). The second photodiode array (2) has a non-amplifying photodiode (10). The first light entry surface (11) and the second light entry surface (21) form sub-surfaces of the exposure surface (91).

14 Claims, 10 Drawing Sheets

(51) Int. Cl.
*H10F 39/00* (2025.01)
*H10F 39/18* (2025.01)

(56) References Cited

U.S. PATENT DOCUMENTS

| | | |
|---|---|---|
| 2012/0205522 A1 | 8/2012 | Richardson et al. |
| 2019/0067495 A1 | 2/2019 | Daly et al. |
| 2019/0099138 A1 | 4/2019 | Kim |
| 2020/0191925 A1 | 6/2020 | Zheng et al. |

* cited by examiner

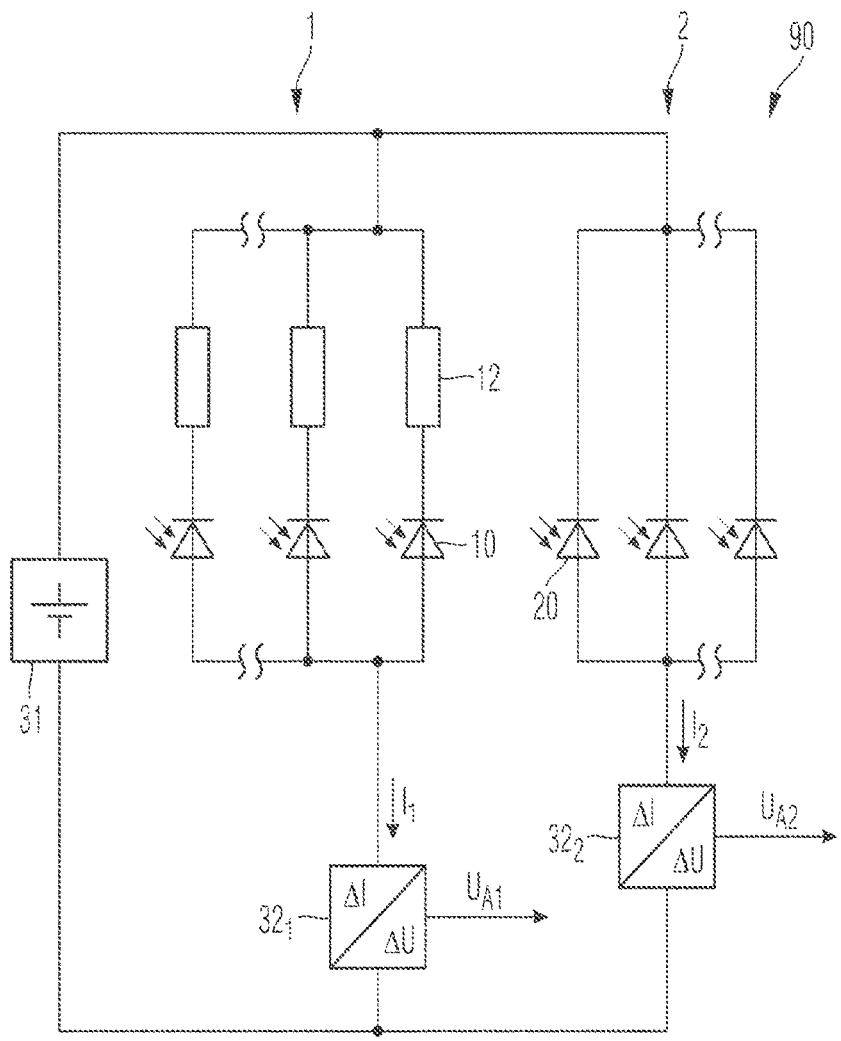

PHOTODETECTOR HAVING AN AVALANCHE PHOTODIODE, RADIATION DETECTOR, POSITRON EMISSION TOMOGRAPH AND METHOD FOR OPERATING A PHOTODETECTOR

TECHNICAL FIELD

The present application relates to photo detectors, in particular, photodiode arrays and other large area photodetectors for the detection of weak light radiation. The application further relates to scintillation counters and other radiation detectors with photodetectors.

BACKGROUND

Photodetectors convert received light into an electrical signal. In a semiconductor photodetector, a photon of sufficient energy generates an electron-hole pair in a semiconductor body electrically biased by two electrodes. The electric field separates the created charge carriers according to their polarity. In simple, non-amplifying semiconductor photodetectors, the charge carriers created by photons flow off directly via the electrodes and impress a photocurrent into a load circuit connecting the two electrodes outside the semiconductor body, the current strength of which is approximately proportional to the number of incident photons. In an avalanche photodiode (APD), the bias voltage is approximately as high as or higher than the avalanche breakdown voltage, so that the created charge carriers, in turn, create further charge carriers. Due to the high amplification in the avalanche breakdown case, single photons are already detectable. In this process, an APD can be operated either in radiation proportional mode or in Geiger mode.

In the radiation proportional operating mode, a single detected photon does not yet drive the avalanche breakdown into its range of saturation. For this purpose, the APD is biased with a blocking voltage that is less than its breakdown voltage. In Geiger mode, the multiplication effect of the avalanche breakdown is so great that the irradiance can no longer be inferred from the photocurrent of the APD. For this purpose, the APD is biased with a blocking voltage that is slightly higher than its breakdown voltage.

Where an APD is configured to count single events, it is also denoted as a GM-APD (Geiger mode APD) or SPAD (single photon avalanche diode). The avalanche breakdown is interrupted by the external shading of the APD. For the duration of the avalanche breakdown, a GM-APD cannot detect any further photons. Usually, therefore, multipixel photodetectors such as MPPCs (multi-pixel photon counters) combine a plurality of GM-APDs, the photocurrents of which are combined prior to evaluation.

SUMMARY

The present application is based on the object of providing an improved photodetector on the basis of one or more avalanche photodiodes.

Such a photodetector is provided. A radiation detector with such a photodetector is also provided, as is a positron emission tomograph with such a radiation detector. A method for operating a photodetector also is provided.

Features and advantages of the disclosed subject matter reveal themselves from the following detailed description and from the figures. The elements and structures shown in the figures are not necessarily depicted true to scale to one another. Identical reference numerals refer to identical or corresponding elements and structures.

BRIEF DESCRIPTION OF THE DRAWINGS

FIGS. 3A-3C show schematic block diagrams of photodetectors according to further embodiments.

DETAILED DESCRIPTION

Figure 1A:
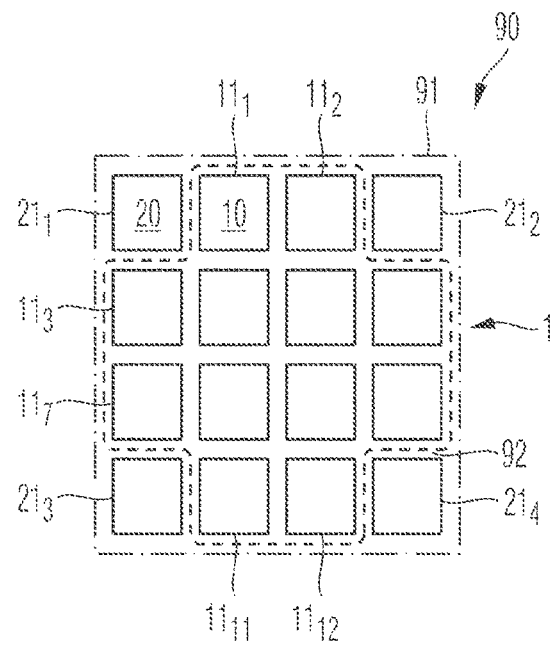
FIGS. 1A-1C show schematic top views of a photodetector with avalanche photodiodes and with non-amplifying photodiodes according to one embodiment.

A photodetector has an exposure surface through which light detectable by the photodetector enters the photodetector. Light falling on the photodetector outside the exposure surface is not detectable by the photodetector. A photon of sufficient energy generates an electron-hole pair in the photodetector.

The photodetector can include a first photodiode array with a first light entrance surface and a second photodiode array with a second light entrance surface. In relation to a surface unit, the first photodiode array can have a higher sensitivity (photoelectric conversion efficiency) than the second photodiode array.

The first photodiode array can include one or more avalanche photodiodes. In this process, each of the avalanche photodiodes can be operated either in radiation proportional mode or in Geiger mode.

In the radiation proportional operating mode, a single detected photon does not yet drive the avalanche breakdown into its range of saturation. For this purpose, the avalanche photodiode is biased with a blocking voltage that can be close to the avalanche breakdown voltage but is less than the avalanche breakdown voltage. In Geiger mode, the multiplication effect of the avalanche breakdown is so great that the irradiance or the number of photons detected can no longer be inferred from the photocurrent of the avalanche photodiode. For this purpose, the avalanche photodiode is biased with a blocking voltage that is slightly higher than its avalanche breakdown voltage. The avalanche photodiode is also wired in such a manner that it operates in avalanche mode. In particular, the photodetector can include an auxiliary voltage source that biases the avalanche photodiode with a blocking voltage in the range of the avalanche breakdown voltage or higher.

The second photodiode array can include one or more non-amplifying photodiodes. In particular, electron-hole pairs generated by the received radiation in a non-amplifying photodiode do not trigger an avalanche breakdown.

The non-amplifying photodiode is also wired in such a manner that it does not operate in avalanche mode. In particular, the photodetector can include an auxiliary voltage source that biases the non-amplifying photodiode with a blocking voltage that is significantly less than the avalanche breakdown voltage. For example, the avalanche photodiode and non-amplifying photodiode have the same or a similar avalanche breakdown voltage and differ substantially based on the shading that biases the avalanche photodiode and the non-amplifying photodiode differently.

Or the avalanche photodiode and the non-amplifying photodiode differ in their internal design and their intrinsic avalanche breakdown voltage in such a manner that, given the same bias voltage, the avalanche photodiode will certainly operate in avalanche mode and the non-amplifying photodiode will certainly not operate in avalanche mode. Alternatively, the avalanche photodiode and non-amplifying photodiode differ both in terms of the intrinsic avalanche breakdown voltage and in terms of the applied bias voltage.

The light entrance surfaces of the first and second photodiode arrays are aligned parallel to one another, e.g., in a co-planar manner, and can form complementary sub-surfaces of an exposure panel of the photodetector, where the sub-surfaces can be laterally separated by a narrow separation region. Light striking the separation region of the exposure panel is not detected.

The exposure panel and the light entrance surfaces can be based on the same geometric basic shape. For example, the exposure panel is a rectangle, e.g., a square, and the first and second light entrance surfaces can be assembled from rectangles of the same size.

The non-amplifying photodiode enables a largely temperature-independent quantitative detection of the radiation in the area of the second light entrance surface. With comparatively high irradiance, the measurement takes place with a comparatively high signal-to-noise ratio. On the other hand, due to the higher field strength acting on the generated electron-hole pair, the avalanche photodiode responds much faster to incident light.

According to one embodiment, the avalanche photodiode can be formed in a section of the exposure panel on which only or predominantly such photons triggered by an event are incident that reach the exposure panel after the event without detours and on a direct path. The non-amplifying photodiode can be formed in a section of the exposure panel on which only or predominantly such photons triggered by the event are incident that reach the exposure panel with detours, i.e., after two or more reflections.

Due to the avalanche-like amplification of the avalanche photodiode, the time of incidence of such photons that reach the exposure panel on a direct path can be determined to a large extent independently of the number of incident photons.

The combination of an avalanche photodiode and a non-amplifying photodiode therefore enables a more precise determination of the amount of total radiation, particularly in applications with systematically unequal distribution of radiation across the exposure panel, at least insofar as the first light entrance surface (the avalanche photodiode) is provided where a lower radiation intensity is to be expected systematically and insofar as the second light entrance surface (the non-amplifying photodiode) is provided where a higher radiation intensity is to be expected systematically.

For example, within an exposure panel of the photodetector, avalanche photodiodes can be arranged or formed predominantly or exclusively in such sections in which the expected photon density is relatively low, where, on one hand, a poorer energy resolution affects the measurement result only to a small extent and, on the other hand, the beginning of a signal to be detected can nevertheless be recognized quickly and reliably. The non-amplifying photodiodes can be arranged or formed predominantly or exclusively in such sections of the exposure panel in which the highest photon density occurs, whereby the energy resolution of the photodetector can be improved significantly.

According to one embodiment, a photocurrent of the non-amplifying photodiode can increase almost linearly with the exposure level over at least two, e.g., at least three or at least four, orders of magnitude of the exposure level. In particular, the non-amplifying photodiode is not an avalanche photodiode operated in radiation proportional mode with usually highly temperature-dependent internal amplification. The output signal of the photodetector can be highly independent of the temperature of the photodetector even without measures for temperature stabilization and without measures to compensate for temperature-related fluctuations of an internal amplification factor.

According to one embodiment, the first photodiode array can be configured in such a manner that the avalanche photodiode is operated in Geiger mode. The bias voltage applied across the avalanche photodiode in the blocking direction is greater than the breakdown voltage. The response time of the photodetector can thus be very short.

According to one embodiment, the first photodiode array can include a plurality of avalanche photodiodes. In this process, the avalanche photodiodes can be arranged electrically in such a manner that the photocurrents of the avalanche photodiodes add up.

In this process, each avalanche photodiode is arranged electrically in a photocurrent path, and the photocurrent paths of all avalanche photodiodes or groups of avalanche photodiodes are electrically connected in parallel. By connecting the avalanche photodiodes in parallel, the photocurrents of all avalanche photodiodes or groups of avalanche photodiodes can be combined into channels and evaluated collectively. Sum photocurrents of individual groups can be evaluated separately from one another and in parallel.

Each of the avalanche photodiodes can form one pixel of a multipixel photodetector. Each of the avalanche photodiodes has a planar partial light entrance surface (effective photo-sensitive area) through which the radiation detected by the avalanche photodiode enters the avalanche photodiode. The partial light entrance surfaces of the avalanche photodiodes can be of the same size or have different sizes.

For example, the partial light entrance surface of an avalanche photodiode can be about $25\times25$ $\mu m^2$, about $50\times50$ $\mu m^2$ or about $75\times75$ $\mu m^2$.

According to another embodiment, the first photodiode array can include exactly one avalanche photodiode. Due to a lack of inactive areas, for example, between adjacent avalanche photodiodes, a first photodiode array with exactly one avalanche photodiode has the highest space efficiency.

The photodetector can include an active circuit electrically connected to the avalanche photodiodes and capable of actively quenching the avalanche breakdown in each of the avalanche photodiodes. According to one exemplary embodiment, each of the photocurrent paths has an ohmic resistive element that acts as a quenching resistor. The quenching resistor is dimensioned in such a manner that, after the avalanche breakdown has been triggered by the voltage drop generated by the photocurrent via the quenching resistor, the bias voltage of the avalanche photodiode is forced below the avalanche breakdown voltage and thus the avalanche breakdown comes to a standstill. The resistance value of the quenching resistor can be in the range from 10 kΩ to 100 kΩ.

The second photodiode array can include a plurality of non-amplifying photodiodes, where the non-amplifying photodiodes are connected electrically in such a manner that photocurrents from the non-amplifying photodiodes add up.

In this process, each non-amplifying photodiode can be arranged electrically in a photocurrent path, and the photocurrent paths of all non-amplifying photodiodes or groups of non-amplifying photodiodes can be electrically connected in parallel. Such shading of the non-amplifying photodiodes combines the photocurrents of all non-amplifying photodiodes or groups of non-amplifying photodiodes into channels. Sum photocurrents of individual groups of non-amplifying photodiodes can be evaluated separately from one another and parallel in time.

Each of the non-amplifying photodiodes can form another pixel of a multipixel photodetector. Each of the non-amplifying photodiodes has a planar partial light entrance surface through which the radiation detected by the non-amplifying photodiode enters the non-amplifying photodiode. The partial light entrance surfaces of all non-amplifying photodiodes can be of the same size or have different sizes.

According to one embodiment, the second photodiode array can include exactly one non-amplifying photodiode. Due to a lack of inactive areas, for example, between adjacent non-amplifying photodiodes, a second photodiode array with exactly one non-amplifying photodiode has the highest space efficiency.

According to one embodiment, at least one part of the first light entrance surface can be arranged inside the exposure panel, and one part of the second light entrance surface can be arranged at the edge of the exposure panel. Such an arrangement can efficiently improve energy resolution, especially in such applications where the photon density in a section of the exposure panel along the edge of the exposure panel is systematically higher than at a distance from the edge of the exposure panel.

According to one embodiment, the exposure panel can be rectangular, where at least one part of the first light entrance surface can be arranged inside the exposure panel and one part of the second light entrance surface can be arranged in each corner of the exposure panel. Such an arrangement can efficiently improve energy resolution, especially in such applications where the photon density in the corners of a rectangular exposure panel is systematically higher than at a distance from the corners.

According to one embodiment, the exposure panel includes a central area and a peripheral area surrounding the central area, where the first light entrance surface can be formed exclusively in the central area and the second light entrance surface can be formed exclusively in the peripheral area. Such an arrangement can improve energy resolution, especially in such applications where the photon density along the edges of the exposure panel is higher than at a distance from the edges.

The avalanche photodiodes can include first semiconducting regions, and the non-amplifying photodiodes can include second semiconducting regions. According to one exemplary embodiment, the first and second semiconducting regions can be formed in different, laterally separated semiconductor substrates. A photodetector according to this exemplary embodiment can be constructed with comparatively little effort from available avalanche photodetectors and available non-amplifying photodiodes.

According to one exemplary embodiment, the first and second semiconducting regions can be formed in the same semiconductor substrate. In a photodetector according to such an exemplary embodiment, the first and second light entrance surfaces can be formed at a comparatively small distance from one another and thus with comparatively little loss of active light entrance surface.

According to one exemplary embodiment, the photodetector can include a separation structure which is configured to dielectrically separate adjacent semiconducting regions of the first photodiode array and the second photodiode array on at least one side of the semiconductor substrate from one another. The separation structure allows different bias voltages for the at least one avalanche photodiode on one hand and the at least one non-amplifying photodiode on the other hand. The separation structure can be designed in such a manner that the breakdown strength is at least 20V, e.g., at least 50V, or more than 200V.

According to an alternative embodiment, the at least one avalanche photodiode and the at least one non-amplifying photodiode can be designed in such a manner that they can be biased with the same blocking voltage. In this process, the avalanche photodiode can have a highly doped multiplication layer in which the electric field is concentrated sufficiently high.

According to one exemplary embodiment, the photodetector can include a control circuit which is configured to evaluate a photocurrent of the second photodiode array as a function of a photocurrent of the first photodiode array. For example, it is possible that a signal received by the first photodiode array triggers the beginning of an evaluation of the output signal of the second photodiode array.

In darkness or in dim light, the signal-to-noise ratio in the photocurrent of the non-amplifying photodiode is comparatively small. The small signal-to-noise ratio leads to a substantially greater uncertainty in determining the beginning of a light pulse compared to the avalanche photodiode. If the exposure level of a weak light pulse is determined by integration via the photocurrent of the non-amplifying photodiode, then the measurement can become inaccurate due to the fact that the beginning of the light pulse is detected too late or estimated too early. On the other hand, the avalanche photodiode has a comparatively good signal-to-noise ratio and a comparatively short response time and can therefore determine the beginning of a light pulse quite accurately. If the beginning of the measuring interval of the non-amplifying photodiode is determined by the output signal of the avalanche photodiode, the quantitative evaluation is improved by the non-amplifying photodiode.

Since, on one hand, the quantitative evaluation is carried out exclusively or predominantly by the hardly temperature-dependent non-amplifying photodiode and, on the other hand, the highly temperature-dependent avalanche photodiode is only used to trigger the evaluation, the photodetector, without any significant loss of measurement accuracy, can also be designed without measures for temperature stabilization and/or for compensation of temperature fluctuations.

For example, a radiation detector can have a scintillator body with a light emitting surface, where light radiation is excitable in the scintillator body by ionizing radiation and at least one part of the excited light radiation exits the scintillator body through the light emitting surface. The light emitting surface can be rectangular, e.g., square. The edge length of a square light emitting surface can assume a value in the range from about 5 mm to about 20 mm, for example, from about 6 mm to 13 mm. A vertical extension of the scintillator body perpendicular to the light emitting surface can be greater than the largest edge length of the light emitting surface and, for example, can be at least twice or at least three times the largest edge length of the light emitting surface. For example, the dimensions of the scintillator body are 6×6×20 mm³, 6×6×50 mm³ or 13×13×50 mm³.

The radiation detector can further include a photodetector of the type described above, where the exposure panel of the photodetector is oriented towards and parallel to the light emitting surface.

In the light emitting surface of a scintillator body, there can often be a systematically uneven distribution of radiation across the exposure panel. A photodetector of the type described above, in which the arrangement of avalanche photodiode(s) and non-amplifying photodiode(s) is adapted to the distribution of radiation to be anticipated, allows a more accurate determination of the amount of ionizing radiation detected in the scintillator body.

According to one embodiment, an outer edge of the exposure panel of the photodetector can be designed approximately flush with an outer edge of the light emitting surface of the scintillator body.

A positron emission tomograph can include at least one pair of radiation detectors of the above-mentioned type, the optical axes of which are arranged in a collinear manner. In particular, light entrance surfaces of the two radiation detectors are oriented towards the same point. The scintillator body detects gamma radiation, for example. Evaluation electronics determine coincidences in the output signals of the two radiation detectors, as well as their running time differences.

The following detailed description refers to the accompanying figures and, together with the figures, forms part of the disclosure, in which reference is made to specific exemplary embodiments of a photodetector, a radiation detector and a positron emission tomograph for illustration purposes. In addition to the exemplary embodiments depicted in the drawings and described, there are further exemplary embodiments. Structural and/or logical changes are possible in the exemplary embodiments depicted in the drawings and described, without deviating from the scope defined by the claims. In particular, features of exemplary embodiments depicted in the drawings and described in the following text can be combined with features of other exemplary embodiments depicted in the drawings and described, unless the context indicates otherwise.

FIG. 1A shows a rectangular exposure panel (surface) 91 of a photodetector 90. The exposure panel 91 lies in a planar plane. The surface area of the exposure panel 91 is at least 1 mm².

The photodetector 90 includes a first photodiode array 1 with a first light entrance surface with twelve laterally separated first partial light entrance surfaces $11_1, 11_2 \ldots 11_{12}$ and a second photodiode array with a second light entrance surface with four laterally separated second partial light entrance surfaces $21_1, 21_2, 21_3, 21_4$.

The first and second partial light entrance surfaces $11_1, 11_2 \ldots 11_{12}, 21_1, 21_2, 21_3, 21_4$ lie co-planar in the same plane or are designed at least approximately co-planar. Each first partial light entrance surface $11_1, 11_2 \ldots 11_{12}$ corresponds to the light entrance surface of an avalanche photodiode 10, where the photodetector 90 can include up to several hundred avalanche photodiodes 10. Each second partial light entrance surface $21_1, 21_2, 21_3, 21_4$ corresponds to the light entrance surface of a non-amplifying photodiode 20.

The first and second partial light entrance surfaces $11_1, 11_2 \ldots 11_{12}, 21_1, 21_2, 21_3, 21_4$ are arranged in a matrix-like manner in rows and columns. A grid-shaped separation area 92 laterally separates adjacent partial light entrance surfaces $11_1, 11_2 \ldots 11_{10}, 21_1, 21_2, 21_3, 21_4$ from one another. Light falling on the light incident side of the photodetector 90 in the separation area 92 is not detected. The non-amplifying photodiodes 20 are arranged exclusively in the corners of the exposure panel 91.

Figure 1B:
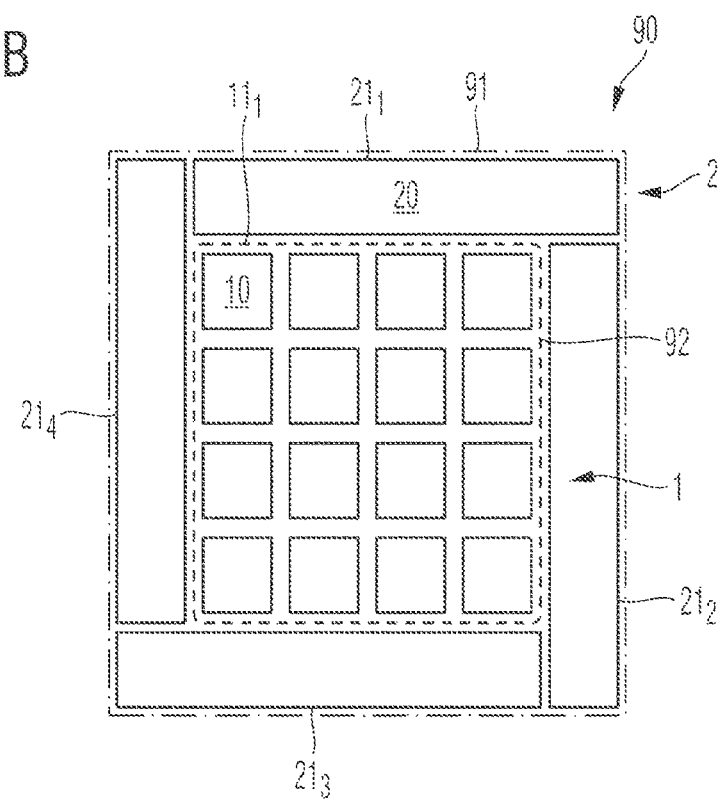

In FIG. 1B, the exposure panel 91 comprises a central area and a peripheral area surrounding the central area in a laterally complete manner. The avalanche photodiodes 10 with the first partial light entrance surfaces $11_1, 11_2 \ldots$ are formed exclusively in the central area. The non-amplifying photodiodes 20 with the second partial light entrance surfaces $21_1, 21_2, 21_3, 21_4$ are provided exclusively in the peripheral area and form a frame around the central area with the avalanche photodiodes 10.

Figure 1C:
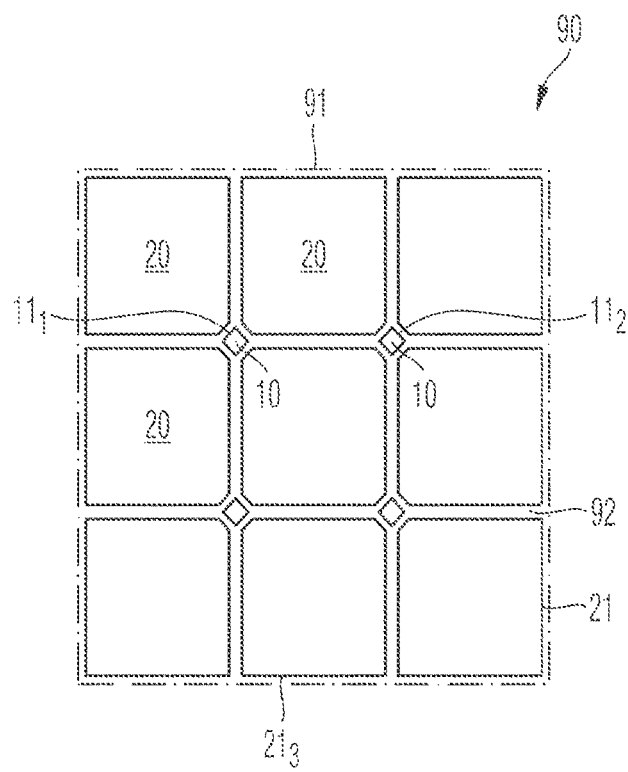

In FIG. 1C, a plurality of approximately equal-sized non-amplifying photodiodes 20 are arranged in rows and columns. The partial light entrance surfaces $11_1, 11_2 \ldots$ of the avalanche photodiodes 10 are comparatively small. The avalanche photodiodes 10 are formed in the separation area 92 between the non-amplifying photodiodes 20 and, in this process, are distributed approximately evenly across the exposure panel 91.

Figure 2A:
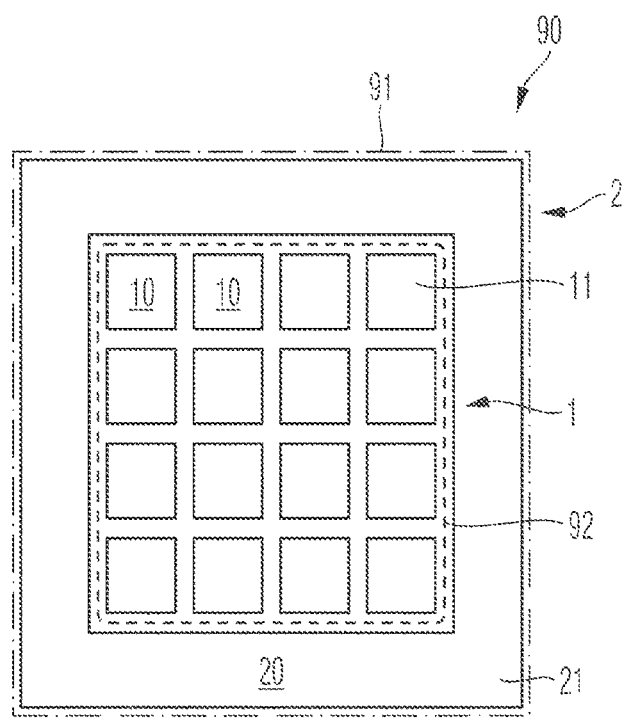
FIGS. 2A-2C show schematic top views of a photodetector with a frame-like non-amplifying photodiode according to a further embodiment.

In FIG. 2A, the second photodiode array 2 comprises exactly one non-amplifying photodiode 20, which is formed in the peripheral area and encloses the central area with avalanche photodiodes 10 arranged in a matrix in a frame-like manner.

Figure 2B:
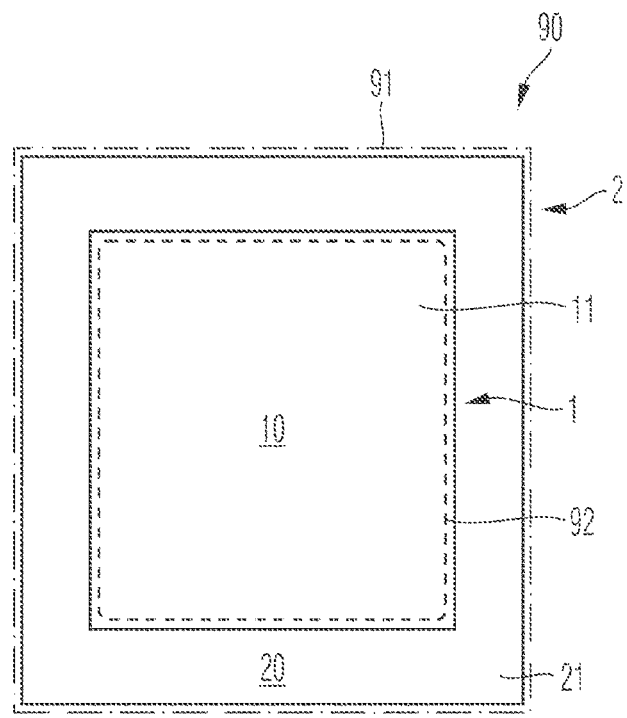

The photodetector 90 depicted in FIG. 2B includes a first photodiode array 1 with exactly one avalanche photodiode 10, which is formed in the central area and is enclosed by exactly one frame-like non-amplifying photodiode 20.

Figure 2C:
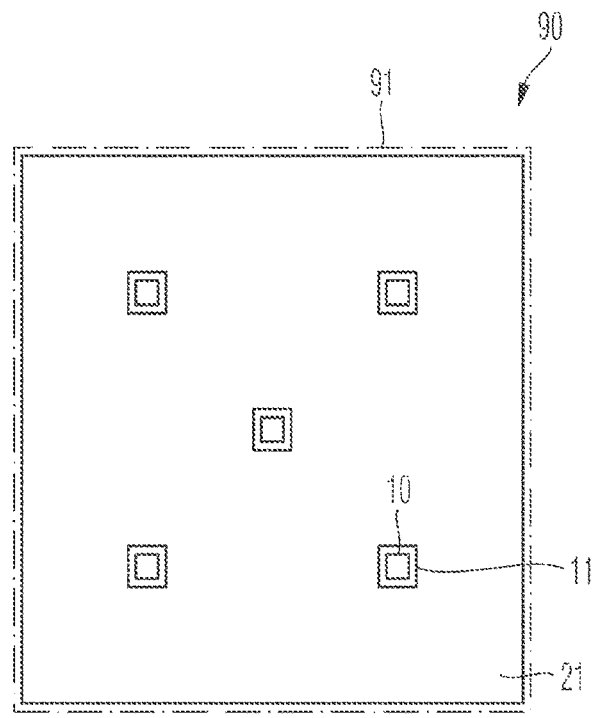

In FIG. 2C, the photodetector 90 comprises a single coherent non-amplifying photodiode 20 and a plurality of avalanche photodiodes 10 with comparatively small partial light entrance surfaces $11_1, 11_2 \ldots$ . The avalanche photodiodes 10 are formed in gaps of the non-amplifying photodiode 20 and, in this process, each is laterally enclosed on all sides by the non-amplifying photodiode 20. The avalanche photodiodes 10 can, in this process, be distributed approximately evenly across the exposure panel 91.

In FIG. 3A, each avalanche photodiode 10 forms a first photocurrent path with a quenching resistor 12 connected in series and each non-amplifying photodiode 20 forms a second photocurrent path. The first photocurrent paths are electrically connected in parallel, and the second photocurrent paths are electrically connected in parallel.

In the examples drawn, the anodes of the avalanche photodiodes 10 are directly electrically connected to one another. The quenching resistors 12 are each drawn on the cathode side of the respective avalanche photodiode 10. According to another exemplary embodiment, the cathodes of the avalanche photodiodes 10 can be directly electrically connected to one another, and the quenching resistors 12 can each be provided on the anode side of the respective avalanche photodiode 10.

The avalanche breakdown voltage of the non-amplifying photodiodes 20 is significantly higher than the avalanche breakdown voltage of the avalanche photodiodes 10.

An auxiliary voltage source 31 biases the avalanche photodiodes 10 and the non-amplifying photodiodes 20 with a bias voltage in the blocking direction. The amount of the bias voltage is higher than the amount of the avalanche breakdown voltage of the avalanche photodiodes 10 by an overvoltage amount and significantly less than the avalanche breakdown voltage of the non-amplifying photodiodes 10. A stabilization circuit (not depicted) can stabilize the bias voltage generated by the auxiliary voltage source 31 and/or track a change in temperature in such a manner that the avalanche amplification of the avalanche photodiode 10 is constant over a wider range of temperature.

A first current/voltage conversion circuit $32_1$ converts the sum photocurrent $I_1$ of the avalanche photodiodes 10 into a first measurement signal $U_{A1}$. The first measurement signal $U_{A1}$, for example, can be a binary signal the "on" state of which indicates almost simultaneously the avalanche breakdown of at least one of the avalanche photodiodes 10 and the "off" state of which indicates that none of the avalanche photodiodes 10 is in avalanche breakdown at the same time. Alternatively, the first measurement signal $U_{A1}$ can be a multi-level signal or an analog signal from which it can be read how many of the avalanche photodiodes 10 are in avalanche breakdown at the same time.

A second current/voltage conversion circuit 322 converts the sum photocurrent $I_2$ of the second photodiodes 20 into a second measurement signal $U_{A2}$. The second measurement signal $U_{A2}$ is proportional to the overall exposure level in the second light entrance surface or in all second partial light entrance surfaces.

In other embodiments (not drawn), the avalanche photodiodes 10, the non-amplifying photodiodes 20, or the avalanche photodiodes 10 and the non-amplifying photodiodes 20 can each be combined into photodiode groups, with the photocurrent paths of each photodiode group being electrically connected in parallel and electrically connected to a first and second current/voltage conversion circuit, respectively, which is associated with only one of the photodiode groups at a time. The current/voltage conversion circuits evaluate the sum photocurrents of the photodiode groups independently of one another.

Figure 3B:
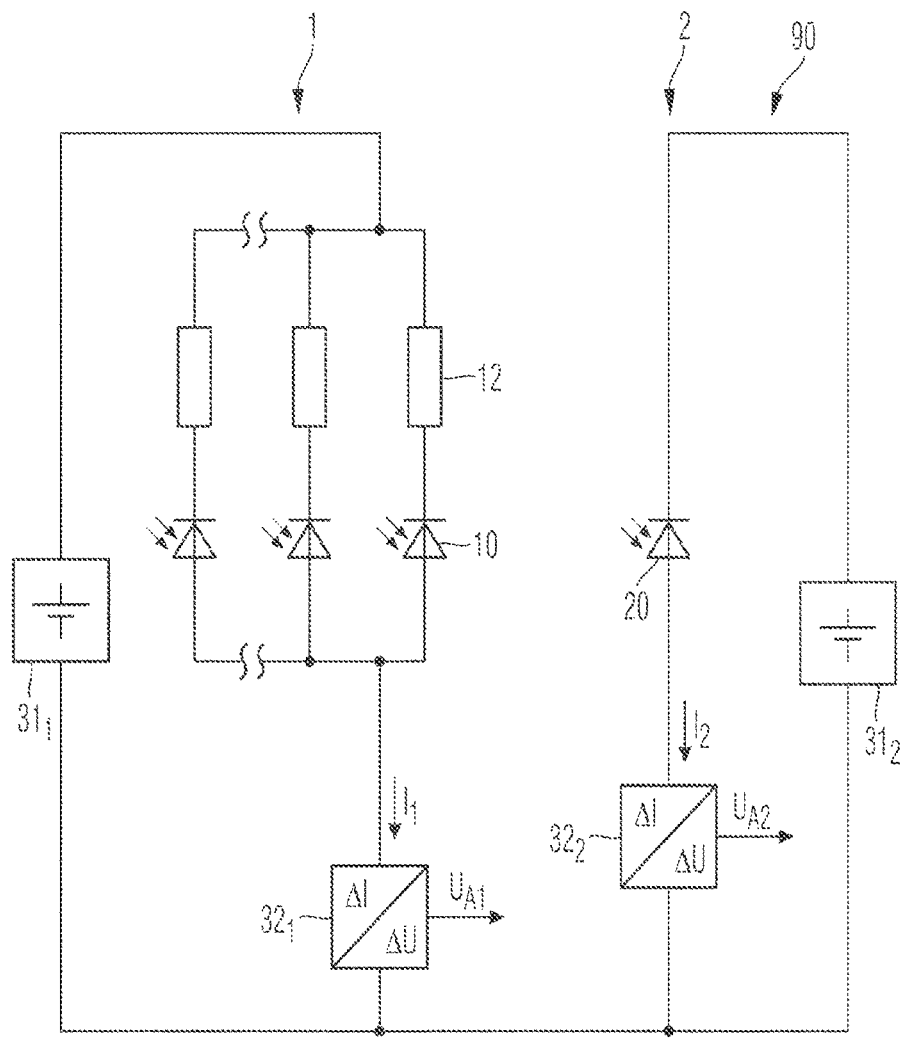

In FIG. 3B, a first auxiliary voltage source 311 biases the avalanche photodiodes 10 with a higher first bias voltage in the blocking direction, and a second auxiliary voltage source 312 biases exactly one non-amplifying photodiode 20 with a lower second bias voltage in the blocking direction. The first bias voltage can be at least two times, for example, at least five times, the second bias voltage.

A first stabilization circuit (not depicted) can stabilize the bias voltage generated by the first auxiliary voltage source 311 and/or track a change in temperature in such a manner that the avalanche amplification of the avalanche photodiodes 10 is constant over a wider range of temperature. Alternatively or additionally, a second stabilization circuit (not depicted) can stabilize the bias voltage generated by the second auxiliary voltage source 312 and/or track a change in temperature in such a manner that parameters of the non-amplifying photodiode 20 remain constant over a wider range of temperature.

Figure 3C:
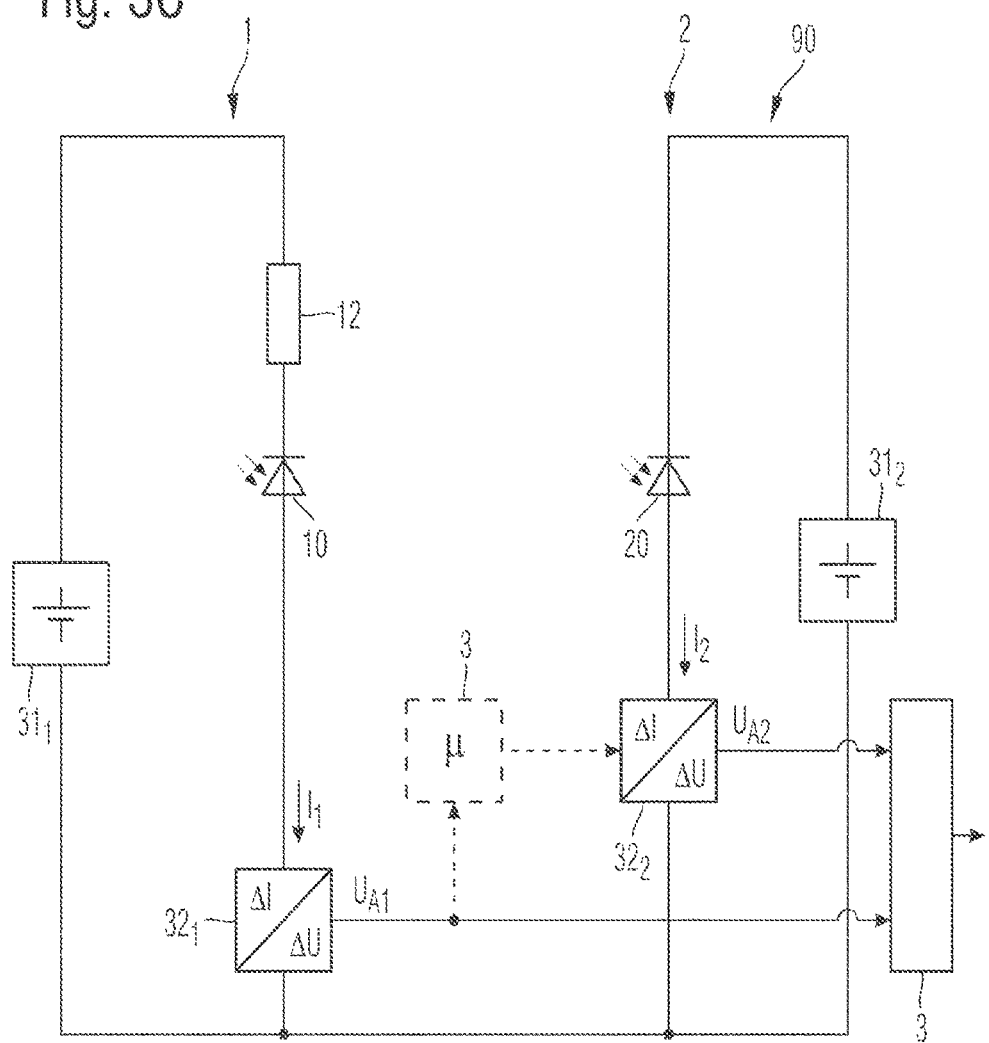

In the photodetector 90 of FIG. 3C, the first photodiode array 1 comprises only a single avalanche photodiode 10. For this purpose, the photodetector 90 includes a control circuit 3 which is electrically connected to the output of the first current/voltage conversion circuit $32_1$ and controls the evaluation of the photocurrent $I_2$ of the second photodiode array 2.

For example, an output of the control circuit 3 can be connected to a control input of the second current/voltage conversion circuit 322, as depicted with the dashed line variant. The control circuit 3, for example, starts the measurement of the photocurrent of the second photodiode array 2 or the output of the second measurement signal $U_{A2}$ with a strongly rising edge of the first measurement signal $U_{A1}$. According to the solid line variant, the control circuit 3 is connected to the output of the second current/voltage conversion circuit 322 and modifies the second measurement signal $U_{A2}$ as a function of the first measurement signal $U_{A1}$.

Figure 4:
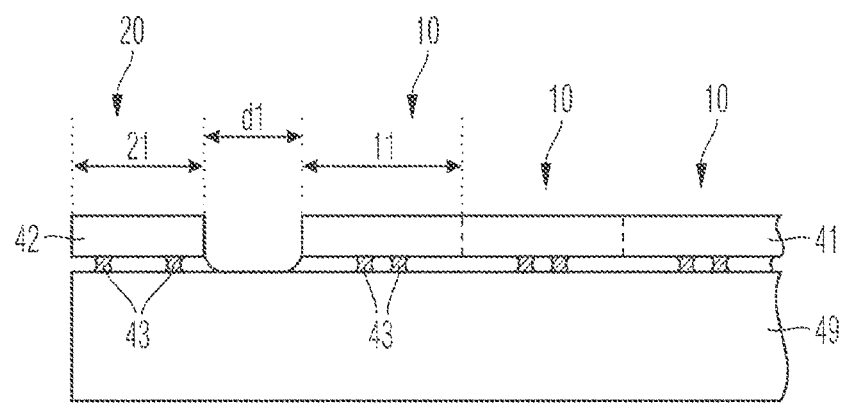
FIG. 4 shows a schematic cross section through a photodetector according to an embodiment with first and second photodiodes formed in separate semiconductor substrates.

FIG. 4 refers to an exemplary embodiment in which the avalanche photodiodes 10 and the non-amplifying photodiode 20 are formed in different semiconductor substrates 41, 42, which can be arranged on a common substrate carrier 49.

The semiconducting regions of the avalanche photodiodes 10 are formed in a first semiconductor substrate 41. The first semiconductor substrate 41, for example, is a silicon substrate and can also include the quenching resistors. For example, the quenching resistors are designed as structures made of doped polycrystalline silicon, an elemental metal, a metal compound and/or a metal alloy on one of the two parallel main surfaces of the first semiconductor substrate 41. The semiconducting regions of a non-amplifying photodiode 20 are formed in a second semiconductor substrate 42.

The first semiconductor substrate 41 and the second semiconductor substrate 42 are deposited side by side on a main surface of a substrate carrier 49. Among other things, conductor tracks can be formed on the main surface of the substrate carrier 49. Electrical contact structures 43 can connect the semiconducting regions and, if applicable, the quenching resistors of the first semiconductor substrate 41 to conducting structures on the main surface of the substrate carrier 40. The electrical contact structures 43 can be designed as soldered connections. A distance d1 between the outer edge of the outermost first light entrance surface 11 to the adjacent edge of the nearest second light entrance surface 21 is as small as technologically possible. For example, the distance d1 is less than 500 μm, for example, less than 250 μm, less than 50 μm, or less than 10 μm.

In the photodetectors 90 of FIGS. 5A-5B and 6A-6B, the semiconducting regions of the first photodiode array 1 and the second photodiode array 2 are each formed in the same semiconductor substrate 40, with the second photodiode array 2 being formed between the first photodiode array 1 and a lateral side surface 48 of the semiconductor substrate 40.

In the exemplary embodiments drawn, the semiconducting regions of a plurality of avalanche photodiodes 10 and a non-amplifying photodiode 20 each comprise a heavily doped electrode well 45 and a heavily doped electrode region 44. The electrode region 44 can be formed as a section of a continuous layer which, for example, extends through the entire semiconductor substrate 40 on the side facing away from the light entrance side in a direction parallel to the light entrance surface.

For example, the electrode well 45 extends into the semiconductor substrate 40 from the light entrance side. A lightly doped detection region 46 is formed between the electrode well 45 and the electrode region 44, which can be n-doped, p-doped or nearly self-conducting. In addition to the electrode well 45, the electrode region 44 and the detection region 46, the semiconducting regions of an avalanche photodiode 10 can include additional doped regions that suitably shape the electric field path between the electrode well 45 and the electrode region 44 to improve the avalanche effect.

Figure 5A:
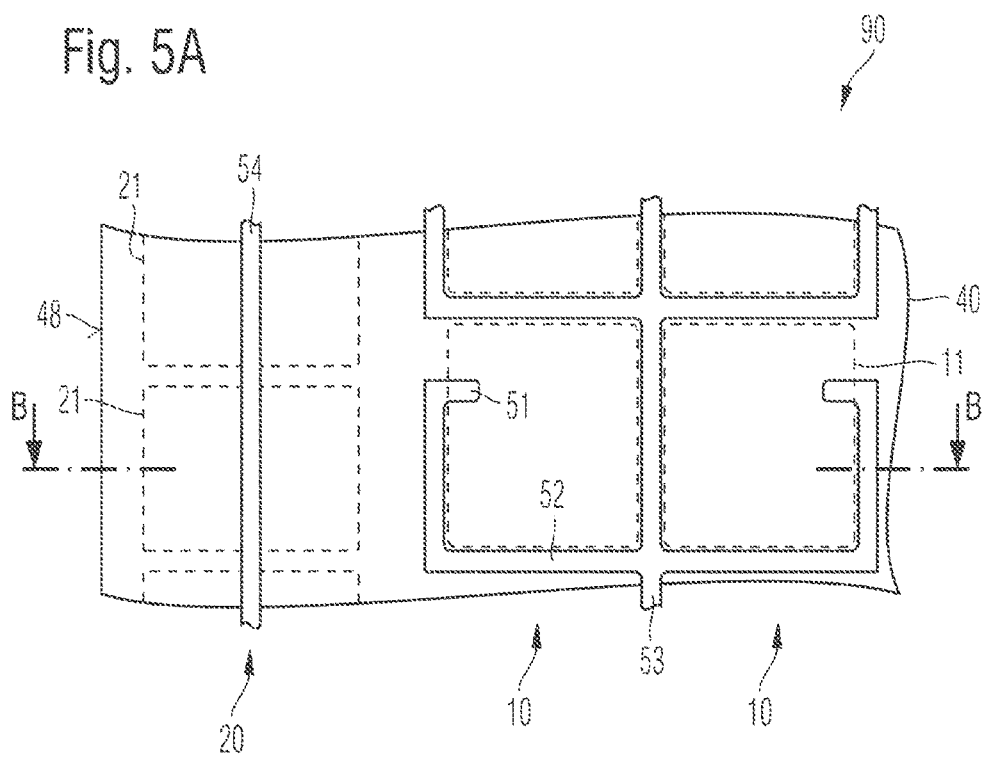
FIGS. 5A-5B show a schematic top view and a schematic cross section through a photodetector according to an embodiment with first and second photodiodes formed in the same semiconductor substrate and with quenching resistors on the light entrance side.
Figure 5B:
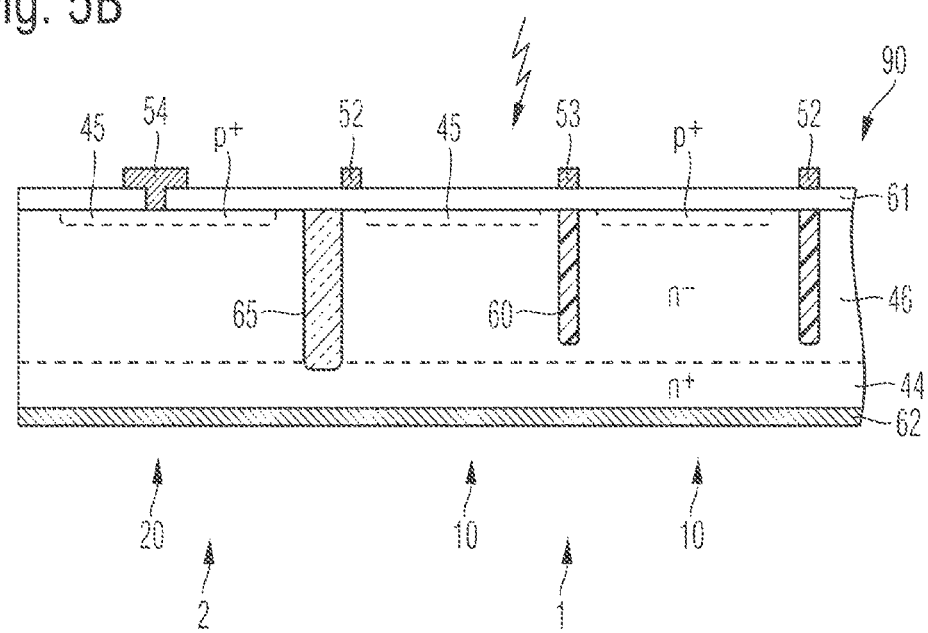

In the embodiment of FIGS. 5A-5B, the electrode well 45 forms the p-doped anode region, and the electrode region 44 forms the n-doped cathode region of the respective photodiode 10, 20.

Figure 6A:
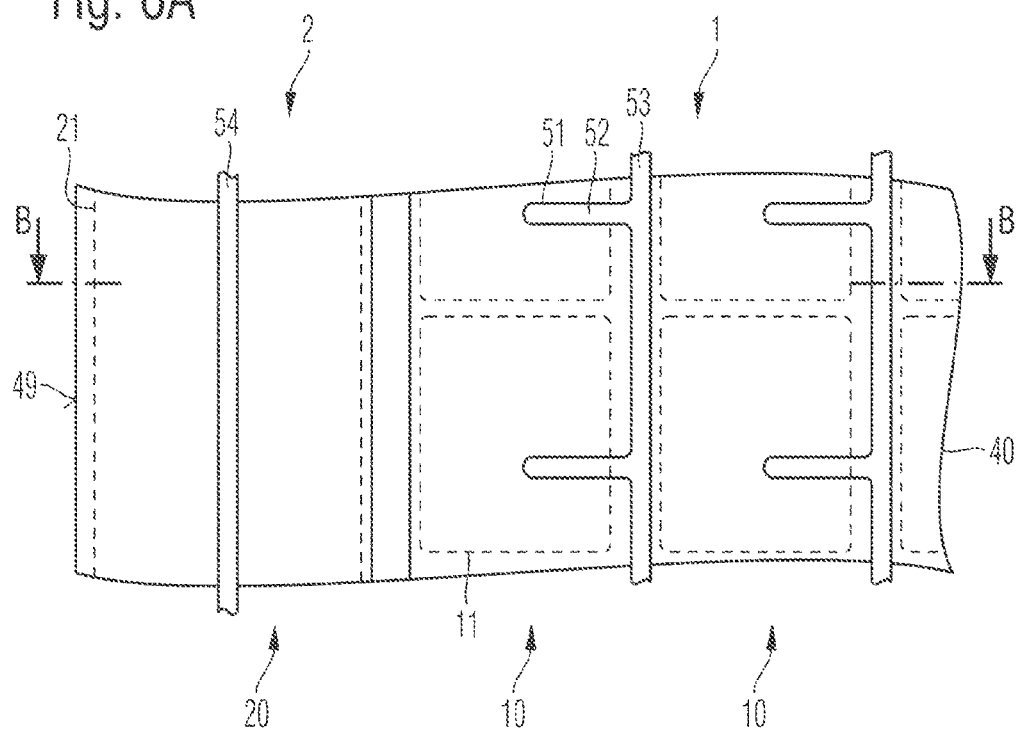
FIGS. 6A-6B show a schematic top view and a schematic cross section through a photodetector according to an embodiment with quenching resistors on the side opposite the light entrance side.
Figure 6B:
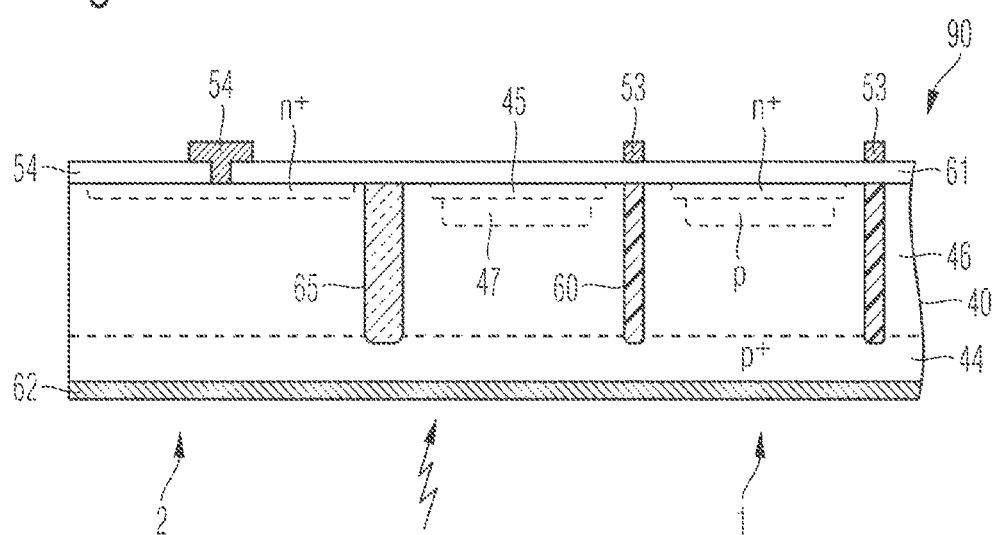

In the embodiment of FIGS. 6A-6B, the electrode well 45 forms the n-doped cathode region, and the electrode region 44 forms the p-doped anode region of the respective photodiode 10, 20 or an accumulation layer of an avalanche photodiode 10.

In the exemplary embodiments drawn, a grid-like separation structure 60 extends into the semiconductor substrate 40 from one of the main surfaces in a separation region between the light entrance surfaces 11, 21. The separation structure 60 can extend to at least half of the extent of the detection layer vertical to the light entrance surfaces 11, 21, for example, to the electrode region 44. The separation structure 60 can comprise a material that reduces optical crosstalk between adjacent photodiodes 10, 20. Alternatively, the separation structure 60 can comprise doped regions.

A separation structure 65 extends between the first photodiode array 1 and the second photodiode array 2 from the side with the electrode wells 45 to the electrode region 44 and separates adjacent semiconducting regions of the first photodiode array 1 and the second photodiode array 2 from one another. The separation structure 65 has at least one dielectric material, for example, a silicon oxide, a silicon nitride, or a doped or undoped glass.

A dielectric passivation layer 61 can be formed on one of the main surfaces of the semiconductor substrate 40. An electrode layer 62 can be formed on a main surface of the semiconductor substrate 40 opposite the passivation layer 61. The electrode layer 62 and the electrode regions 44 form ohmic contacts with low contact resistance. The electrode layer 62, for example, can be electrically connected to a conductive structure on the light entrance side via vias (not drawn).

Connection structures of the photodiode arrays 1, 2 are formed on the dielectric passivation layer 61. Each connection structure for an avalanche photodiode 10 can comprise a connection contact 51 which extends through an opening in the dielectric passivation layer 61 to or into the electrode well 45. The electrode well 45 and the connection contact 51 form an ohmic contact with low contact resistance.

The connection structure can comprise an ohmic resistive element 52, a first end of which is electrically connected to the connection contact 51, for each avalanche photodiode 10. The ohmic resistive element 52 forms a quenching resistance as described above.

The connection structure for each avalanche photodiode 10 further comprises conductor tracks 53 which, in each case, can be connected to the second ends of the ohmic resistive elements 52 of avalanche photodiodes 10 electrically connected in parallel.

The connection structure for an avalanche photodiode 10 can be formed in such a manner that it is formed predominantly or exclusively in the separation area between the first partial light entrance surfaces and between the first and second light entrance surfaces 11, 21.

The connection structure for the non-amplifying photodiode 20 can comprise a further connection line 54 which extends through an opening in the dielectric passivation layer 61 to or into the electrode well 45 of the non-amplifying photodiode 20. The electrode well 45 of the non-amplifying photodiode 20 and the further connection line 54 form an ohmic contact with little contact resistance.

In the exemplary embodiment of FIGS. 5A-5B, the connection structures 51, 52, 53, 54 are formed on the light entrance side.

In the exemplary embodiment of FIGS. 6A-6B, the connection structures 51, 52, 53, 54 are formed on the side of the semiconductor substrate 40 opposite the light entrance side. On the light entrance side, the electrode layer 62 can be made of a transparent conductive material, for example, a tin oxide. The semiconducting regions of the avalanche photodiodes 10 also include p-doped avalanche breakdown areas 47 between the electrode wells 45 and the detection regions 46.

Figure 7:
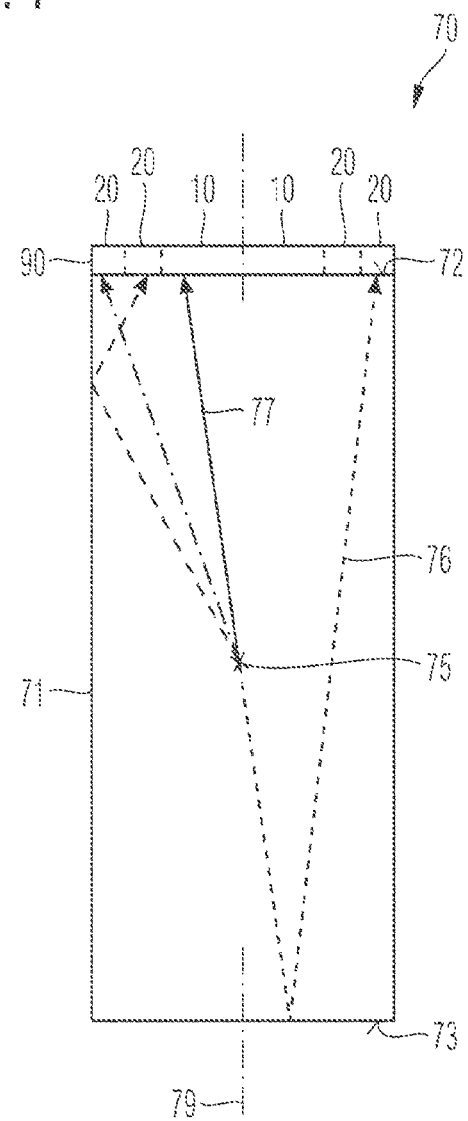
FIG. 7 shows a schematic longitudinal cross section through a radiation detector with a scintillator body and photodetector according to a further embodiment.

FIG. 7 shows a radiation detector 70 with a scintillator body 71 and a photodetector 90. The light entrance side of the photodetector 90 is oriented towards a planar light emitting surface 72 of the scintillator body 71 and can be applied directly to the light emitting surface 72. The scintillator body 71 is transparent and can be solid or a liquid enclosed in a container. The scintillator body 71 can include a plurality of different materials, of which at least one converts ionizing radiation into light pulses. The ionizing radiation can be X-rays, alpha radiation, beta radiation, gamma radiation or neutron radiation or any other particle radiation.

The scintillator body 71 can be in the form of a straight prism or straight cylinder, where a light entrance surface 73 parallel to the light emitting surface 72 can lie opposite the light emitting surface 72. Apart from the light emitting surface 72 and, if applicable, the light entrance surface 73, the surface of the scintillator body 71 can be coated reflectively, for example, with a Teflon reflector.

In the exemplary embodiment drawn, ionizing radiation at location 75 triggers photons 76, 77. First photons 77 directly strike the light emitting surface 72. Second photons 76, which initially strike surfaces of the scintillator body 71 other than the light emitting surface 72, are reflected back into the scintillator body 71 and strike the light emitting surface 72 only after one or more reflections.

Depending on the specific application, the distribution of the locations 75 in the scintillator body 71 and/or the dimensions of the scintillator body 71, the photons generated can be concentrated in the corners or at the edges of the light emitting surface 72 of the scintillator body 71. For example, in particular, the second photons 76 that are reflected one or more times can be concentrated in the corners or at the edges of the light emitting surface 72. This can be the case, for example, if the length of the scintillator body 71 is greater than the largest edge length of the light emitting surface 72.

Due to the on average longer path of the second photons 76 in the scintillator body 71, the second photons arrive on average later at the light emitting surface 71 than the first photons 77.

Figure 8:
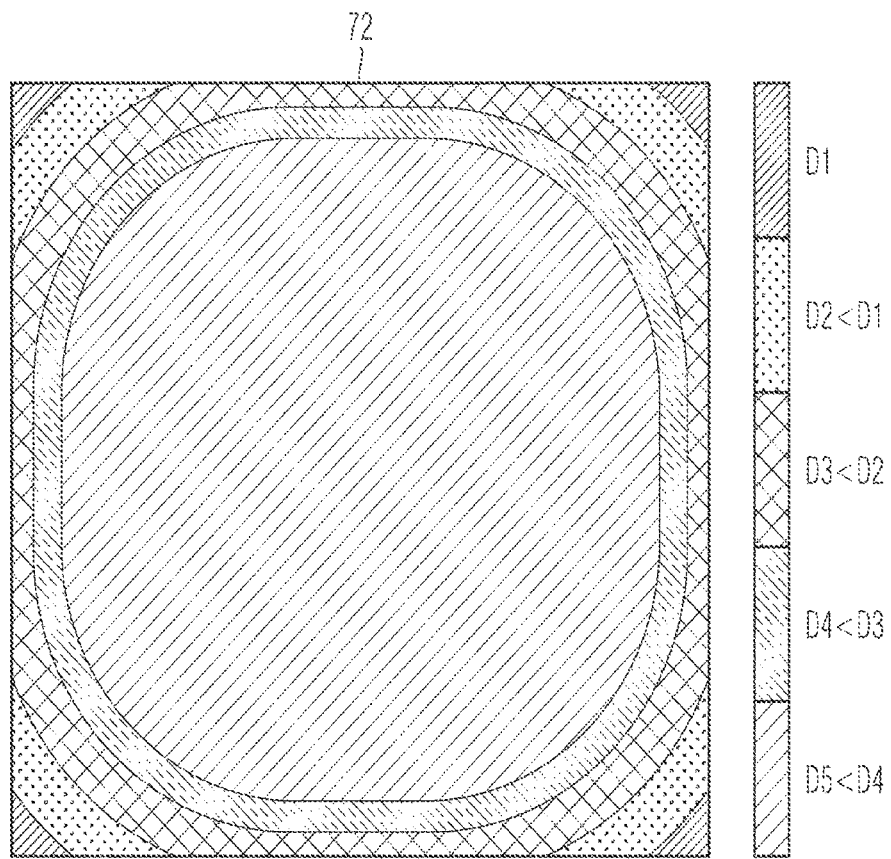
FIG. 8 shows an example of the light distribution in a light emitting surface of a scintillator body for the discussion of effects of embodiments.

FIG. 8 shows schematically the photon density in the light emitting surface 72 of the scintillator body 71 of FIG. 7 according to one application. The scintillator body, for example, comprises a cuboid consisting of or including a NaI(Tl) crystal, for example. The light emitting surface 72 is square with an edge length of about 10 cm. The length of the scintillator body is 40 cm. With the exception of the light emitting surface 72, all surfaces of the scintillator body are coated with Teflon or $TiO_2$.

The photon density is approximately rotationally symmetrical to the center point of the light emitting surface 72 at rotation angles of 90°, 180° and 270°. The photon density increases steadily in the radial direction starting from the center point of the light emitting surface 72. The average photon density D1 in the corners of the light emitting surface 72 is higher than the average photon density D2 in inwardly connecting circle segments which terminate along the edges of the light emitting surface 72. The average photon density D2 in the circle segments is higher than the average photon density D3 in an outer ring within the circle segments and along the edges of the light emitting surface 72 between the circle segments. The average photon density D3 in the outer ring within the circle segments is higher than the average photon density D4 in an inwardly connecting inner ring. The average photon density D4 in the inner ring is higher than the average photon density D5 in a central area enclosed by the inner ring.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A radiation detector, comprising:
a scintillator body with a light emitting surface, wherein light radiation is excitable in the scintillator body by ionizing radiation and at least one part of the excited light radiation exits the scintillator body through the light emitting surface; and
a photodetector with an exposure surface, the photodetector comprising: a first photodiode array with a first light entrance surface; and a second photodiode array with a second light entrance surface,
wherein the first photodiode array includes an avalanche photodiode,
wherein the second photodiode array includes a non-amplifying photodiode,
wherein the first light entrance surface and the second light entrance surface form partial surfaces of the exposure surface of the photodetector,
wherein the exposure surface includes a central area and a peripheral area surrounding the central area,
wherein the first light entrance surface is formed exclusively in the central area,
wherein the second light entrance surface is exclusively formed in the peripheral area,
wherein the exposure surface of the photodetector is oriented towards the light emitting surface of the scintillator body,
wherein the light emitting surface and the exposure surface are oriented parallel towards one another.

2. The radiation detector of claim 1, wherein a photocurrent of the non-amplifying photodiode increases linearly with exposure level over at least two orders of magnitude of the exposure level.

3. The radiation detector of claim 1, wherein the first photodiode array is configured to operate the avalanche photodiode in Geiger mode.

4. The radiation detector of claim 1, wherein the first photodiode array includes a plurality of avalanche photodiodes, and wherein the avalanche photodiodes are arranged such that photocurrents of the avalanche photodiodes add up.

5. The radiation detector of claim 4, wherein a quenching resistor is connected in series to each of the avalanche photodiodes.

6. The radiation detector of claim 1, wherein the second photodiode array includes exactly one non-amplifying photodiode.

7. The radiation detector of claim 1, wherein at least one part of the first light entrance surface is arranged inside the exposure surface and one part of the second light entrance surface is arranged at an edge of the exposure surface.

8. The radiation detector of claim 1, wherein the exposure surface is rectangular, wherein at least one part of the first light entrance surface is arranged inside the exposure surface, and wherein one section of the second light entrance surface is arranged in each corner of the exposure surface.

9. The radiation detector of claim 1, wherein the first photodiode array includes first semiconducting regions, wherein the second photodiode array includes second semiconducting regions, and wherein the first semiconducting regions and the second semiconducting regions are formed in a semiconductor substrate.

10. The radiation detector of claim 9, further comprising:
a separation structure configured to dielectrically separate adjacent semiconducting regions of the first photodiode array and the second photodiode array on at least one side of the semiconductor substrate.

11. The radiation detector of claim 1, further comprising:
a control circuit configured to evaluate a photocurrent of the second photodiode array as a function of a photocurrent of the first photodiode array.

12. The radiation detector of claim 1, wherein an outer edge of the exposure surface is approximately flush with an outer edge of the light emitting surface.

13. A positron emission tomograph, comprising:
at least one pair of radiation detectors according to claim 1, wherein optical axes of the at least one pair of radiation detectors are arranged in a collinear manner.

14. A method for operating the radiation detector of claim 1, the method comprising:
evaluating a photocurrent of the second photodiode array as a function of the photocurrent of the first photodiode array.

* * * * *